US009441295B2

(12) United States Patent
Rozenzon et al.

(10) Patent No.: US 9,441,295 B2
(45) Date of Patent: Sep. 13, 2016

(54) MULTI-CHANNEL GAS-DELIVERY SYSTEM

(75) Inventors: Yan Rozenzon, San Carlos, CA (US);
Robert T. Trujillo, Saratoga, CA (US);
Steven C. Beese, Fremont, CA (US)

(73) Assignee: SolarCity Corporation, San Mateo, CA (US)

( * ) Notice: Subject to any disclaimer, the term of this patent is extended or adjusted under 35 U.S.C. 154(b) by 1038 days.

(21) Appl. No.: 12/952,127

(22) Filed: Nov. 22, 2010

(65) Prior Publication Data

US 2011/0277690 A1 Nov. 17, 2011

Related U.S. Application Data

(60) Provisional application No. 61/334,987, filed on May 14, 2010.

(51) Int. Cl.
*C23C 16/455* (2006.01)
*C30B 25/14* (2006.01)

(52) U.S. Cl.
CPC ... *C23C 16/45565* (2013.01); *C23C 16/45512* (2013.01); *C23C 16/45514* (2013.01); *C23C 16/45561* (2013.01); *C23C 16/45563* (2013.01); *C23C 16/45578* (2013.01); *C30B 25/14* (2013.01); *Y10T 137/8158* (2015.04)

(58) Field of Classification Search
CPC .................. C23C 16/45565; C23C 16/45514; C23C 16/45512; C23C 16/45578; C23C 16/45563; C23C 16/45561; C30B 25/14; Y10T 137/8158
USPC .......................... 118/715; 156/345.33–345.34
See application file for complete search history.

(56) References Cited

U.S. PATENT DOCUMENTS

| | | | | |
|---|---|---|---|---|
| 3,603,284 | A | * 9/1971 | Garnache | C23C 16/4588 118/725 |
| 3,637,434 | A | * 1/1972 | Nakanuma | C23C 14/34 117/935 |
| 3,658,585 | A |   4/1972 | Folkmann | |
| 3,675,619 | A | * 7/1972 | Burd | C23C 16/00 118/719 |
| 3,699,298 | A | * 10/1972 | Briody | H01C 17/20 118/725 |

(Continued)

FOREIGN PATENT DOCUMENTS

| | | |
|---|---|---|
| JP | H11288890 A | 10/1999 |
| JP | 2003158054 A | 5/2003 |

(Continued)

OTHER PUBLICATIONS

Beaucarne, G et al., "Epitaxial thin-film Si solar cells", pp. 533-542, Science Direct, www.sciencedirect.com, Thin Solid Films 511-512 (2006) 533-542.

*Primary Examiner* — Rudy Zervigon
(74) *Attorney, Agent, or Firm* — Shun Yao; Park, Vaughan, Fleming & Dowler LLP

(57) ABSTRACT

One embodiment of the present invention provides a gas-delivery system for delivering reaction gas to a reactor chamber. The gas-delivery system includes a main gas-inlet port for receiving reaction gases and a gas-delivery plate that includes a plurality of gas channels. A gas channel includes a plurality of gas holes for allowing the reaction gases to enter the reactor chamber from the gas channel. The gas-delivery system further includes a plurality of sub-gas lines coupling together the main gas-inlet port and the gas-delivery plate, and a respective sub-gas line is configured to deliver a portion of the received reaction gases to a corresponding gas channel.

17 Claims, 6 Drawing Sheets
(1 of 6 Drawing Sheet(s) Filed in Color)

(56) References Cited

U.S. PATENT DOCUMENTS

| | | | | |
|---|---|---|---|---|
| 3,796,182 A * | 3/1974 | Rosler | C23C 16/481 | |
| | | | 118/319 | |
| 3,806,360 A * | 4/1974 | Briody | C23C 16/4588 | |
| | | | 117/101 | |
| 4,168,998 A * | 9/1979 | Hasegawa | C30B 25/18 | |
| | | | 117/101 | |
| 4,193,756 A | 3/1980 | Leon | | |
| 4,268,374 A * | 5/1981 | Lepselter | H01J 37/32091 | |
| | | | 156/345.43 | |
| 4,298,443 A * | 11/1981 | Maydan | H01J 37/34 | |
| | | | 156/917 | |
| 4,325,778 A * | 4/1982 | Lepselter | H01J 37/32091 | |
| | | | 204/192.32 | |
| 4,496,828 A * | 1/1985 | Kusmierz | C30B 25/12 | |
| | | | 118/50.1 | |
| 4,522,149 A * | 6/1985 | Garbis | C23C 16/458 | |
| | | | 118/500 | |
| 4,558,660 A * | 12/1985 | Nishizawa | C30B 25/105 | |
| | | | 118/50.1 | |
| 4,565,157 A * | 1/1986 | Brors | C23C 16/42 | |
| | | | 118/719 | |
| 4,579,080 A * | 4/1986 | Martin | C23C 16/4411 | |
| | | | 118/500 | |
| 4,612,207 A * | 9/1986 | Jansen | C23C 16/5093 | |
| | | | 118/692 | |
| 4,661,199 A * | 4/1987 | Looney | C30B 25/12 | |
| | | | 117/935 | |
| 4,747,367 A * | 5/1988 | Posa | C23C 16/455 | |
| | | | 118/50.1 | |
| 4,761,269 A * | 8/1988 | Conger | C23C 16/45561 | |
| | | | 118/679 | |
| 4,786,352 A * | 11/1988 | Benzing | B08B 7/0035 | |
| | | | 134/1 | |
| 4,794,220 A * | 12/1988 | Sekiya | C23C 16/4588 | |
| | | | 118/50.1 | |
| 4,807,562 A * | 2/1989 | Sandys | C23C 16/455 | |
| | | | 118/715 | |
| 4,823,736 A * | 4/1989 | Post | C30B 25/12 | |
| | | | 118/500 | |
| 4,838,983 A * | 6/1989 | Schumaker | C23C 16/455 | |
| | | | 117/101 | |
| 4,839,145 A | 6/1989 | Gale | | |
| 4,858,558 A | 8/1989 | Ohmura | | |
| 4,928,626 A * | 5/1990 | Carlson | C23C 16/455 | |
| | | | 117/101 | |
| 5,038,711 A * | 8/1991 | Dan | C30B 25/02 | |
| | | | 118/668 | |
| 5,053,247 A * | 10/1991 | Moore | C23C 16/44 | |
| | | | 118/724 | |
| 5,074,245 A | 12/1991 | Ota | | |
| 5,119,540 A | 6/1992 | Kong | | |
| 5,121,531 A * | 6/1992 | Severns | C23C 16/4587 | |
| | | | 118/728 | |
| 5,151,133 A * | 9/1992 | Ohmine | C23C 16/4588 | |
| | | | 118/715 | |
| 5,207,835 A * | 5/1993 | Moore | C23C 16/44 | |
| | | | 118/724 | |
| 5,269,847 A | 12/1993 | Anderson | | |
| 5,288,364 A * | 2/1994 | Burt | C30B 25/105 | |
| | | | 117/86 | |
| 5,350,455 A * | 9/1994 | Mahler | C23C 14/50 | |
| | | | 118/503 | |
| 5,373,806 A * | 12/1994 | Logar | C30B 25/10 | |
| | | | 117/106 | |
| 5,374,159 A * | 12/1994 | Severns | C23C 16/4401 | |
| | | | 414/222.04 | |
| 5,427,824 A * | 6/1995 | Inushima | C23C 16/0245 | |
| | | | 257/E21.279 | |
| 5,441,571 A * | 8/1995 | Ohta | C30B 25/14 | |
| | | | 118/729 | |
| 5,453,124 A * | 9/1995 | Moslehi | C23C 16/45561 | |
| | | | 118/715 | |
| 5,458,918 A * | 10/1995 | Hawkins | C30B 25/14 | |
| | | | 118/715 | |
| 5,476,359 A * | 12/1995 | Severns | C23C 16/4401 | |
| | | | 414/806 | |
| 5,505,778 A | 4/1996 | Ono | | |
| 5,518,549 A * | 5/1996 | Hellwig | C23C 16/4588 | |
| | | | 118/715 | |
| 5,532,190 A * | 7/1996 | Goodyear | C23C 16/45512 | |
| | | | 118/715 | |
| 5,614,447 A | 3/1997 | Yamaga | | |
| 5,629,245 A * | 5/1997 | Inushima | C23C 16/0245 | |
| | | | 216/13 | |
| 5,700,422 A | 12/1997 | Usui | | |
| 5,871,586 A * | 2/1999 | Crawley | C23C 16/45514 | |
| | | | 118/715 | |
| 5,916,369 A * | 6/1999 | Anderson | C23C 16/455 | |
| | | | 118/715 | |
| 5,950,925 A * | 9/1999 | Fukunaga | C23C 16/45512 | |
| | | | 118/715 | |
| 5,964,948 A * | 10/1999 | Dietze | C23C 16/4412 | |
| | | | 118/715 | |
| 5,993,555 A * | 11/1999 | Hamilton | C23C 16/45561 | |
| | | | 118/715 | |
| 5,994,675 A | 11/1999 | Bethune | | |
| 6,013,338 A * | 1/2000 | Inushima | C23C 16/0245 | |
| | | | 257/E21.279 | |
| 6,110,289 A * | 8/2000 | Moore | C23C 16/4588 | |
| | | | 118/666 | |
| 6,113,984 A * | 9/2000 | MacLeish | C23C 16/45508 | |
| | | | 118/715 | |
| 6,120,605 A | 9/2000 | Sato | | |
| 6,129,048 A * | 10/2000 | Sullivan | C23C 16/4401 | |
| | | | 118/728 | |
| 6,193,804 B1 | 2/2001 | Chang | | |
| 6,214,116 B1 * | 4/2001 | Shin | C23C 16/45504 | |
| | | | 118/640 | |
| 6,217,662 B1 * | 4/2001 | Kong | C30B 25/12 | |
| | | | 118/723 I | |
| 6,262,393 B1 * | 7/2001 | Imai | C23C 16/458 | |
| | | | 118/50.1 | |
| 6,338,756 B2 * | 1/2002 | Dietze | 117/84 | |
| 6,348,397 B2 * | 2/2002 | Ide | 438/542 | |
| 6,399,510 B1 | 6/2002 | Riley | | |
| 6,435,428 B2 * | 8/2002 | Kim | C23C 16/452 | |
| | | | 239/553 | |
| 6,472,639 B2 * | 10/2002 | Nishitani | C30B 25/105 | |
| | | | 118/50.1 | |
| 6,475,284 B1 * | 11/2002 | Moore | C23C 16/45502 | |
| | | | 118/715 | |
| 6,478,923 B1 | 11/2002 | Igarashi | | |
| 6,500,734 B2 * | 12/2002 | Anderson | C23C 16/45504 | |
| | | | 438/478 | |
| 6,506,256 B2 * | 1/2003 | Ide | H01L 21/68771 | |
| | | | 118/500 | |
| 6,530,990 B2 * | 3/2003 | Kong | C30B 25/12 | |
| | | | 117/101 | |
| 6,544,333 B2 * | 4/2003 | Keck | C23C 16/24 | |
| | | | 117/200 | |
| 6,562,128 B1 * | 5/2003 | Dietze | C30B 25/02 | |
| | | | 117/102 | |
| 6,747,249 B2 * | 6/2004 | Robinson | F27B 17/00 | |
| | | | 118/730 | |
| 6,814,811 B2 * | 11/2004 | Ose | C23C 16/45561 | |
| | | | 118/715 | |
| 6,916,399 B1 * | 7/2005 | Rozenzon | H01J 37/321 | |
| | | | 118/715 | |
| 6,934,145 B2 * | 8/2005 | Hsieh | H01G 4/385 | |
| | | | 361/301.4 | |
| 7,153,368 B2 * | 12/2006 | Preti | C23C 16/45589 | |
| | | | 118/715 | |
| 7,159,537 B2 * | 1/2007 | Wickramanayaka | H01J 37/3244 | |
| | | | 118/715 | |
| 7,270,713 B2 * | 9/2007 | Blonigan | C23C 16/455 | |
| | | | 118/715 | |
| 7,273,526 B2 * | 9/2007 | Shinriki | C23C 16/34 | |
| | | | 118/715 | |
| 7,314,526 B1 * | 1/2008 | Preti | C30B 25/14 | |
| | | | 118/715 | |
| 7,354,622 B2 * | 4/2008 | Shinriki | C23C 16/452 | |
| | | | 118/724 | |

(56) References Cited

U.S. PATENT DOCUMENTS

| | | | |
|---|---|---|---|
| 7,462,246 B2* | 12/2008 | Hellwig | C23C 16/4588 118/715 |
| 7,628,863 B2* | 12/2009 | Sen | H01L 21/67103 118/715 |
| 7,918,938 B2* | 4/2011 | Provencher | C23C 16/45536 118/715 |
| 8,080,107 B2* | 12/2011 | Kennedy | C23C 16/45565 118/715 |
| 8,133,323 B2* | 3/2012 | Kakegawa | C23C 16/34 118/715 |
| 8,183,132 B2* | 5/2012 | Nijhawan | C30B 25/02 438/46 |
| 8,231,799 B2* | 7/2012 | Bera | H01J 37/32082 118/715 |
| 8,257,547 B2* | 9/2012 | Pei | H01L 21/6708 118/728 |
| 8,268,078 B2* | 9/2012 | Suzuki | C23C 16/16 118/715 |
| 8,288,645 B2 | 10/2012 | Lee | |
| 8,388,753 B2* | 3/2013 | Pei | C23C 14/3407 118/715 |
| 8,404,049 B2* | 3/2013 | Hellwig | C30B 25/12 118/725 |
| 8,430,962 B2* | 4/2013 | Masuda | C23C 16/45561 118/663 |
| 8,448,598 B2* | 5/2013 | Pei | B05C 5/02 118/623 |
| 8,539,908 B2* | 9/2013 | Takagi | C23C 16/45521 118/695 |
| 8,562,745 B2* | 10/2013 | Rozenzon | C23C 16/24 118/715 |
| 8,608,854 B2* | 12/2013 | Pei | C23C 16/45578 118/715 |
| 8,764,902 B2* | 7/2014 | Suzuki | C23C 16/45565 118/715 |
| 8,778,079 B2* | 7/2014 | Begarney | C23C 16/45508 118/715 |
| 8,808,454 B2* | 8/2014 | Lee | C23C 16/45565 118/715 |
| 8,877,000 B2* | 11/2014 | Strang | C23C 16/455 118/697 |
| 8,967,081 B2* | 3/2015 | Borean | C23C 16/45565 118/723 E |
| 8,980,005 B2* | 3/2015 | Carlson | 118/715 |
| 9,117,670 B2* | 8/2015 | Abedijaberi | H01L 21/02532 |
| 2001/0040100 A1* | 11/2001 | Wang | C25D 5/026 205/220 |
| 2002/0004309 A1 | 1/2002 | Collins | |
| 2002/0102859 A1 | 8/2002 | Yoo | |
| 2003/0012885 A1 | 1/2003 | Gramarossa | |
| 2003/0019428 A1* | 1/2003 | Ku | C23C 16/455 118/715 |
| 2003/0145791 A1* | 8/2003 | Shinya | H01L 21/67 118/724 |
| 2004/0135979 A1 | 7/2004 | Hazelton | |
| 2005/0016956 A1 | 1/2005 | Liu | |
| 2005/0208217 A1* | 9/2005 | Shinriki | C23C 16/34 427/248.1 |
| 2005/0229848 A1* | 10/2005 | Shinriki | C23C 16/34 118/715 |
| 2006/0016559 A1* | 1/2006 | Kobayashi | H01J 37/32082 156/345.34 |
| 2006/0060791 A1 | 3/2006 | Hazelton | |
| 2006/0124169 A1* | 6/2006 | Mizusawa | G05D 11/132 137/7 |
| 2006/0191118 A1 | 8/2006 | Lee | |
| 2006/0191637 A1* | 8/2006 | Zajac | B81C 1/00547 156/345.34 |
| 2006/0201414 A1 | 9/2006 | Brabant | |
| 2006/0231035 A1* | 10/2006 | Hellwig | C30B 25/12 117/728 |
| 2007/0131173 A1 | 6/2007 | Halpin | |
| 2007/0175391 A1* | 8/2007 | Mizusawa | C23C 16/455 118/689 |
| 2007/0181181 A1* | 8/2007 | Mizusawa | C23C 16/45565 137/1 |
| 2007/0247075 A1* | 10/2007 | Kim | H01J 37/321 315/111.21 |
| 2007/0249173 A1* | 10/2007 | Kim | H01J 37/32091 438/711 |
| 2007/0251642 A1* | 11/2007 | Bera | H01J 37/32082 156/345.26 |
| 2007/0254483 A1* | 11/2007 | Bera | H01J 37/32244 438/689 |
| 2007/0254486 A1* | 11/2007 | Bera | H01J 37/32091 438/706 |
| 2009/0081878 A1* | 3/2009 | Dhindsa | H01J 37/32091 438/729 |
| 2009/0117746 A1* | 5/2009 | Masuda | C23C 16/45561 438/710 |
| 2009/0139570 A1 | 6/2009 | Kinoshita | |
| 2009/0194235 A1* | 8/2009 | Kobayashi | H01J 37/32082 156/345.28 |
| 2009/0311869 A1* | 12/2009 | Okesaku | H01J 37/3244 438/710 |
| 2010/0092697 A1* | 4/2010 | Poppe | C23C 16/45502 427/585 |
| 2010/0092698 A1* | 4/2010 | Poppe | C23C 16/4408 427/585 |
| 2010/0183825 A1 | 7/2010 | Becker | |
| 2010/0263587 A1 | 10/2010 | Sivaramakrishnan | |
| 2010/0313877 A1 | 12/2010 | Bellman | |
| 2011/0048325 A1* | 3/2011 | Choi | C23C 16/452 118/712 |
| 2011/0067632 A1* | 3/2011 | Poppe | C23C 16/4412 118/728 |
| 2011/0277688 A1* | 11/2011 | Trujillo | C23C 16/44 118/715 |
| 2011/0277690 A1* | 11/2011 | Rozenzon | C23C 16/45561 118/723 MW |
| 2011/0283941 A1* | 11/2011 | Rozenzon | C23C 16/24 118/723 MW |
| 2012/0111271 A1* | 5/2012 | Begarney | C23C 16/45508 118/724 |

FOREIGN PATENT DOCUMENTS

| | | |
|---|---|---|
| JP | 2003277936 A | 10/2003 |
| JP | 2006080098 A | 3/2006 |
| KR | 20060117134 A | 11/2006 |

* cited by examiner

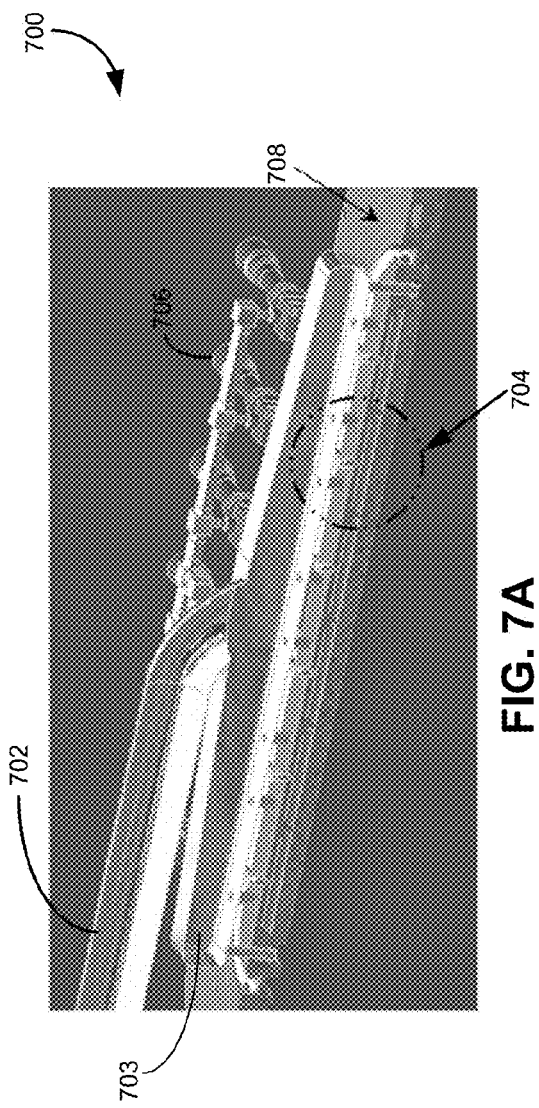
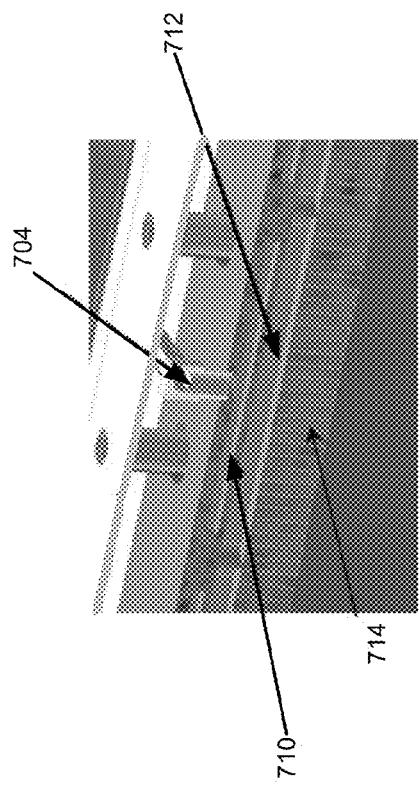

MULTI-CHANNEL GAS-DELIVERY SYSTEM

RELATED APPLICATION

This application claims the benefit of U.S. Provisional Application No. 61/334,987, entitled "Uniform Gas Flow over Multiple Wafers in a High Volume EPI Reactor" by inventors Yan Rozenzon, Robert T. Trujillo, and Steven C. Beese, filed 14 May 2010.

The subject matter of this application is related to the subject matter of U.S. patent application Ser. No. 12/355,463, entitled "Scalable, High-Throughput, Multi-Chamber Epitaxial Reactor for Silicon Deposition," by inventors Steve Poppe, Yan Rozenzon, David Z. Chen, Xiaole Yan, Peijun Ding, and Zheng Xu, filed 16 Jan. 2009, the disclosures of which are incorporated by reference in their entirety herein.

This invention was made with government support under DE-EE0000589 awarded by Department of Energy. The government has certain rights in the invention.

BACKGROUND

1. Field

This disclosure is generally related to deposition systems. More specifically, this disclosure is related to a multi-channel gas-delivery system used in a deposition reactor.

2. Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

A solar cell converts light into electricity using the photoelectric effect. There are several basic solar cell structures, including a single p-n junction, p-i-n/n-i-p, and multi-junction. A typical single p-n junction structure includes a p-type doped layer and an n-type doped layer of similar material. A heterojunction structure includes at least two layers of materials of different bandgaps. A p-i-n/n-i-p structure includes a p-type doped layer, an n-type doped layer, and an optional intrinsic (undoped) semiconductor layer (the i-layer) sandwiched between the p-layer and the n-layer. A multi junction structure includes multiple semiconductor layers of different bandgaps stacked on top of one another.

In a solar cell, light is absorbed near the p-n junction generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

Materials that can be used to construct solar cells include amorphous silicon (a-Si), polycrystalline silicon (poly-Si), crystalline silicon (c-Si), cadmium telluride (CdTe), etc. FIG. 1 illustrates an exemplary crystalline-silicon thin-film solar cell. Solar cell 100 includes a low-grade crystalline-Si substrate 102, a p-type doped single-crystal Si layer 104, an $n^+$ silicon emitter layer 106, front electrodes 108, and an Al back electrode 110. Arrows in FIG. 1 indicate incident sunlight.

Based on industrial surveys, c-Si wafer-based solar cells dominate nearly 90% of the market. However, the cost of producing c-Si wafer-based solar cells is high, and the waste of Si material during the ingot-cutting process and the wafer-polishing process has caused a bottleneck in the supply of crystalline-Si wafers. Due to the soaring price and the supply shortage of Si material, there has been a great interest in alternative ways to manufacture solar cells. Recently, photovoltaic thin-film technology has been drawing vast interest because it can significantly reduce the amount of material used, thus lowering the cost of solar cells. Among various competing technologies, single-crystal Si thin-film solar cells have drawn great interest for their low cost and high efficiency.

Single-crystal Si thin-film solar cells can be created using conventional semiconductor epitaxy technologies which not only reduce manufacturing costs but also enable flexible doping levels in the emitter, absorber and back surface field of the solar cell, thus enhancing its efficiency. Single-crystal Si thin-film solar cells with an efficiency as high as 17% have been demonstrated in research labs (see M. Reutuer et al., "17% Efficient 50 μm Thick Solar Cells," *Technical Digest, 17$^{th}$ International Photovoltaic Science and Engineering Conference, Fukuoka, Japan*, p. 424).

A high-quality single-crystal Si thin film can be produced using Si epitaxy, which has been widely used in the semiconductor industry to create a high-quality single-crystal Si layer for CMOS integrated circuits, power devices and high-voltage discrete devices. Among possible Si epitaxial deposition techniques, trichlorosilane (TCS) based chemical vapor deposition (CVD) can provide a deposition rate of up to 10 μm/min. Therefore, it is possible to achieve a high-throughput and low-cost epitaxial process for solar cell application.

However, there is a lack of suitable Si epitaxy tools that can meet the demand for high throughput and low deposition cost for Si film layers with thicknesses up to tens of microns, as required by the solar cell industry. Existing Si epitaxy tools, such as AMC7810™and Centura 5200™by Applied Materials, Inc., of Santa Clara, Calif., US; MT7700™by Moore Epitaxial, Inc., of Tracy, Calif., US; PE2061™by LPE Epitaxial Technology of Italy; and Epsilon 3200™by ASM International of the Netherlands, are optimized for the needs of semiconductor device manufacturing. Although these epitaxial tools can deliver Si films with the highest quality, these tools are not compatible, in terms of throughput and gas conversion efficiency, with the economics of the solar cell industry.

FIG. 2 presents a diagram illustrating the structure of an existing barrel epitaxial reactor (prior art), such as that used for the batch processing of multiple wafers. Barrel reactor 200 includes a reaction chamber 202, which has a gas inlet 204 at the top and a vent 206 at the bottom. A vertically positioned susceptor 208 holds a number of wafers, such as wafer 210. Radio frequency (RF) heating coils 212 radiate heat onto the susceptor and wafers. Although barrel reactor 200 can batch process multiple wafers, the number of wafers it can process is limited by the architect of the system, the size of the chamber, and the design of the susceptor. Once built, it is difficult to modify the reactor or the susceptor to accommodate more wafers. In addition, the susceptor needs to be rotated during deposition in order to allow a uniform gas flow over each wafer during the deposition process.

SUMMARY

One embodiment of the present invention provides a gas-delivery system for delivering reaction gas to a reactor chamber. The gas-delivery system includes a main gas-inlet port for receiving reaction gases and a gas-delivery plate that includes a plurality of gas channels. A gas channel includes a plurality of gas holes for allowing the reaction gases to enter the reactor chamber from the gas channel. The gas-delivery system further includes a plurality of sub-gas lines coupling together the main gas-inlet port and the gas-delivery plate, and a respective sub-gas line is configured to deliver a portion of the received reaction gases to a corresponding gas channel.

In a variation on the embodiment, the gas-delivery system further includes a main gas line configured to deliver the reaction gases to the main-gas-inlet port.

In a further variation, the main gas line includes a stainless steel tube with an outer diameter of 0.5 inch In a variation on the embodiment, at least one of the sub-gas lines is coupled to a flow control valve configured to individually control a gas flow rate within the sub-gas lines, thereby facilitating a uniform gas flow into the reactor chamber.

In a further variation, the flow control valve is a bellow metering valve (BMV).

In a variation on the embodiment, at least one of the sub-gas lines include a stainless steel tube with an outer diameter of 0.25 inch.

In a variation on the embodiment, the gas holes have a diameter of 1 mm.

In a variation on the embodiment, the gas-delivery system further includes a gas diffuser situated between a sub-gas line and a corresponding gas channel.

BRIEF DESCRIPTION OF THE FIGURES

Color Drawings

The patent or application file contains at least one drawing executed in color. Copies of this patent or patent application publication with color drawing(s) will be provided by the Office upon request and payment of the necessary fee.

FIG. 7A presents a diagram illustrating a 3-dimensional (3-D) view of a multi-channel gas-delivery system in accordance with an embodiment of the present invention.

FIG. 7B presents a 3-D diagram illustrating the amplified view of a region close to sub-gas line 704, in accordance with an embodiment of the present invention.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure.

Thus, the present invention is not limited to the embodiments shown, but is to be accorded the widest scope consistent with the principles and features disclosed herein.

Overview

Embodiments of the present invention provide a multi-channel gas-delivery system used in a material deposition reactor. The gas-delivery system includes a main gas-inlet port and a multi-channel gas-delivery plate. During operation, process gas enters the multi-channel gas-delivery plate via the main gas-inlet port. The multi-channel gas-delivery plate includes a plurality of equally spaced channels, each leading to a flow control valve, which controls the gas flow in a respective channel. The processing gas enters the reaction chamber through the multiple channels located on the gas-delivery plate. By individually controlling the flow rate of each channel, the multi-channel gas-delivery system can ensure a uniform gas flow over each wafer surface.

Chamber and Susceptors

Figure 1:
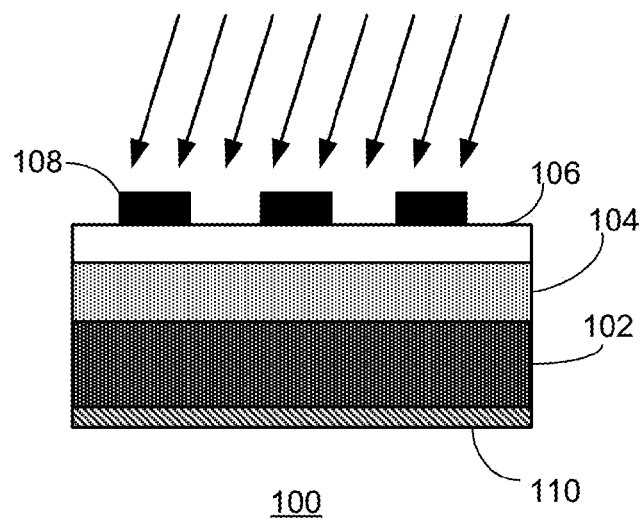
FIG. 1 presents a diagram illustrating the structure of an exemplary crystalline-Si thin-film solar cell.
Figure 2:
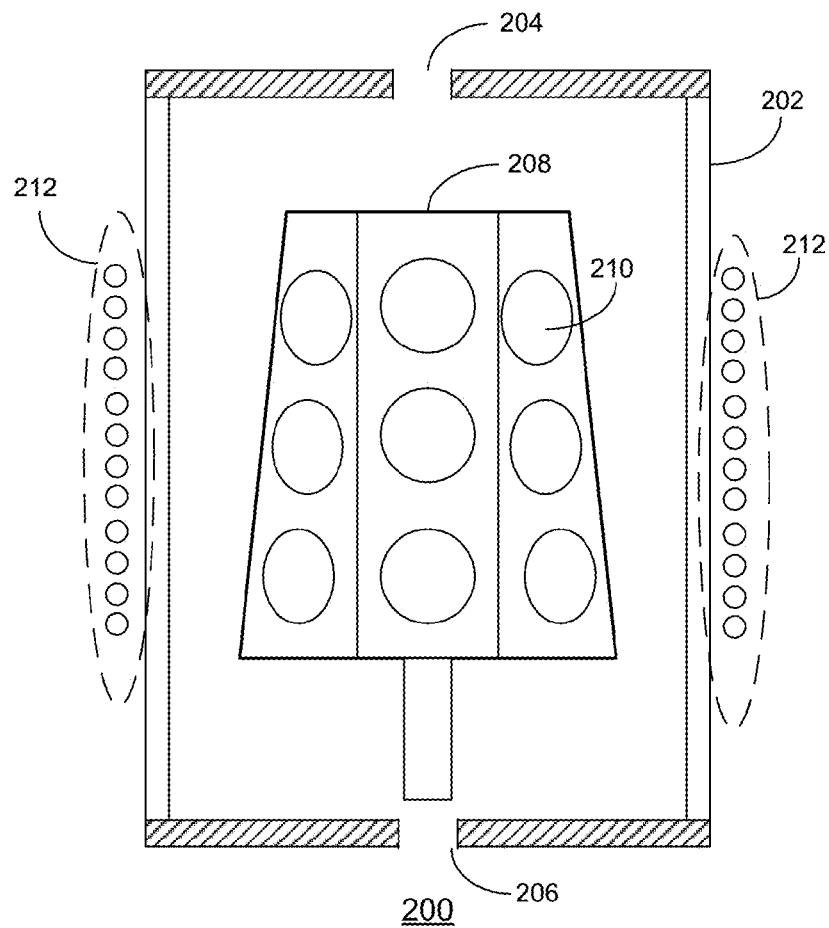
FIG. 2 presents a diagram illustrating an existing barrel reactor (prior art).
Figure 3A:
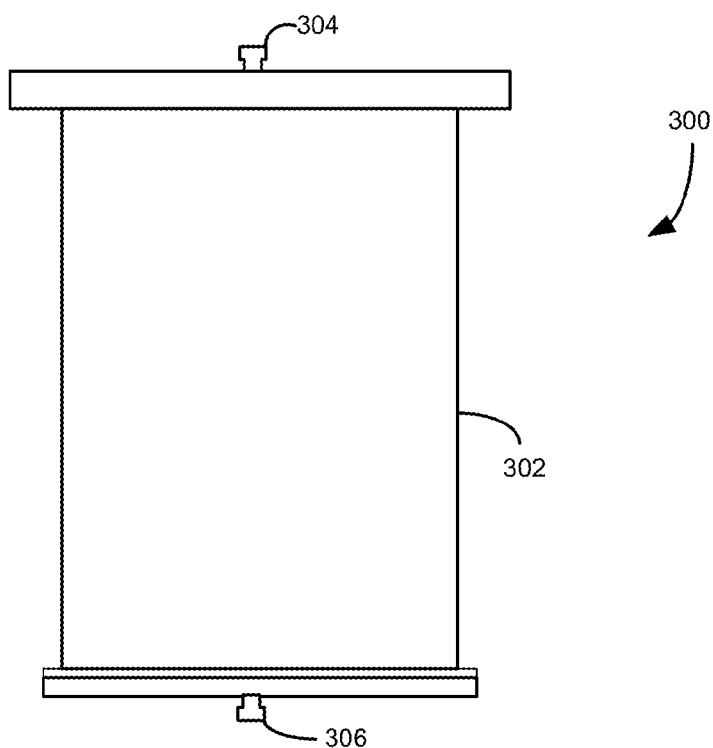
FIG. 3A presents a diagram illustrating the side view of an exemplary deposition reactor in accordance with an embodiment of the present invention.

FIG. 3A presents a diagram illustrating the side view of an exemplary deposition reactor in accordance with an embodiment of the present invention. In this example, deposition reactor 300 includes a reactor chamber 302, a gas-inlet port 304, and a gas-outlet port 306.

Figure 3B:
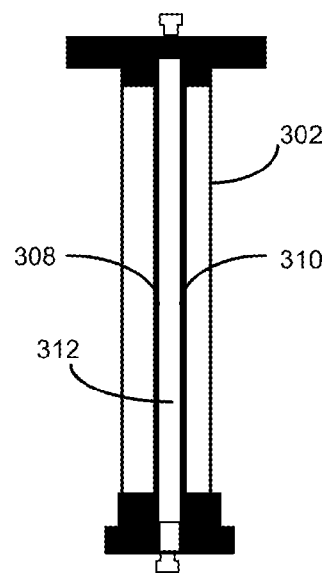
FIG. 3B presents a diagram illustrating the front view of a cross section of an exemplary deposition reactor in accordance with an embodiment of the present invention.

FIG. 3B presents a diagram illustrating the front view of a cross section of an exemplary deposition reactor in accordance with an embodiment of the present invention. FIG. 3B demonstrates that a pair of susceptors 308 and 310 are placed vertically inside reaction chamber 302. A narrow channel 312 is formed between susceptors 308 and 310.

Figure 4A:
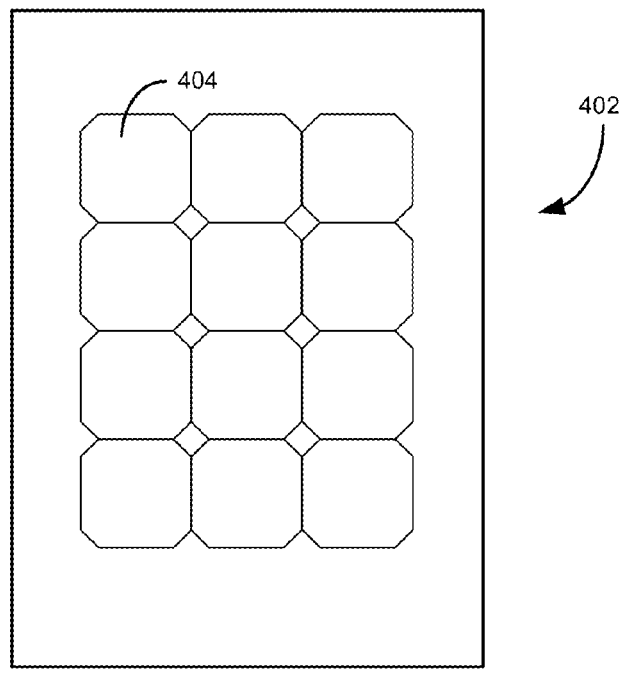
FIG. 4A presents a diagram illustrating the front side of a susceptor in accordance with an embodiment of the present invention.

FIG. 4A presents a diagram illustrating the front side of a susceptor in accordance with an embodiment of the present invention. During deposition, a susceptor 402 is placed vertically inside the reactor chamber. To avoid heat absorption by chamber walls, the reactor chamber is formed using a material that is transparent to radiant heat. In one embodiment, the reactor chamber is formed using quartz. By contrast, susceptor 402 is formed using a material that is opaque and absorbs radiant heat energy, such as SiC-coated graphite and monolithic SiC. In one embodiment, susceptor 402 is formed using SiC-coated graphite. As a result, most of the radiant heat from lamp-heating units located outside the reactor chamber is absorbed by susceptor 402.

Figure 4B:
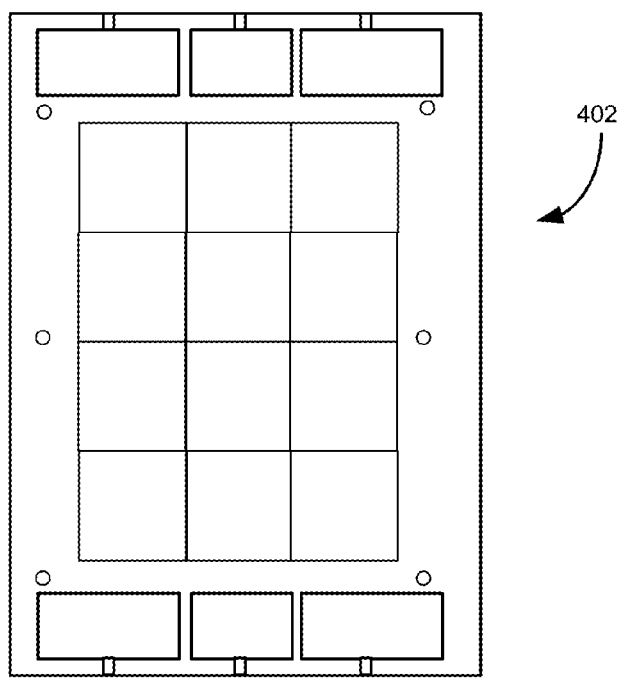
FIG. 4B presents a diagram illustrating the back side of a susceptor in accordance with an embodiment.

The front side of susceptor 402 includes a set of pockets, such as pocket 404, for supporting substrates to be deposited. The shape of the bottom of the pockets is carefully designed to ensure a good thermal contact between the susceptor and the substrates. In one embodiment, the bottom of pocket 404 has a contour shape. Depending on the size of susceptor 402, various numbers of substrates can fit onto susceptor 402. In one embodiment, susceptor 402 includes 12 pockets for supporting 12 125×125 mm$^2$ substrates. FIG. 4B presents a diagram illustrating the back side of a susceptor in accordance with an embodiment.

Detailed descriptions of the deposition reactor, including the reactor chamber and the susceptors, can be found in U.S. patent application Ser. No. 12/355,463 (Attorney Docket No. SSP08-1003US), entitled "Scalable, High-Throughput, Multi-Chamber Epitaxial Reactor for Silicon Deposition," by inventors Steve Poppe, Yan Rozenzon, Davis Z. Chen, Xiaole Yan, Peijun Ding, and Zheng Xu, filed 16 Jan. 2009, the disclosures of which are incorporated by reference in their entirety herein.

Gas-Delivery System

In a solar cell, film uniformity greatly impacts the solar cell's efficiency. In a traditional epitaxial system, it has been difficult to achieve good deposition uniformity and a high reaction-gas-utilization rate at the same time. Substrate rotation can be used to improve uniformity. However, it becomes increasingly difficult to rotate substrates in a large batch reactor. To achieve better deposition uniformity, the aforementioned U.S. patent application Ser. No. 12/355,463 has proposed to inject precursor gases, such as TCS and $H_2$, into the narrow channel formed by the two interlocked susceptors from the top and bottom of the reactor chamber, alternately. It is important to address the uniformity issue across the horizontal direction, where the gas flow rate over each wafer varies depending on the location of the wafer. For example, a wafer placed directly underneath the precursor gas inlet may experience a higher gas flow rate compared with another wafer placed on the edge. The different gas flow rates over the different wafers may result in non-uniform deposition result.

Figure 5:
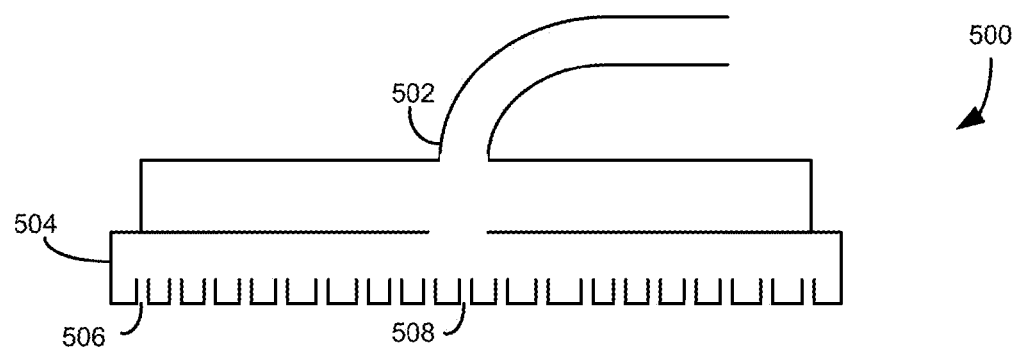
FIG. 5 presents a diagram illustrating a cross-sectional view of a conventional gas-delivery system.

FIG. 5 presents a diagram illustrating a cross-sectional view of a conventional gas-delivery system. Gas-delivery system 500 includes a main gas-inlet port 502 and a single-channel gas-delivery plate 504. Gas-delivery plate 504 includes a plurality of gas holes, such as gas holes 506 and 508, coupled to the reactor chamber (not shown). During deposition, precursor gas is delivered to gas-delivery plate 504 via main gas-inlet port 502. Once the precursor gas filled the single large channel within single-channel gas-delivery plate 504, it will enter the reactor chamber through the plurality of gas holes, such as gas holes 506 and 508. Note that because of the geometry configurations of single-channel gas-delivery plate 504 and the reactor chamber, the gas flow rate into the reactor chamber can be non-uniform. For example, gas holes that are directly beneath main gas-inlet port 502, such as gas hole 508, can have a slightly higher gas flow rate than that of gas holes that are further away, such as gas hole 506. Such a non-uniform gas flow rate can result in a non-uniform deposition rate, and thus non-uniform film thickness of wafers located at different locations.

Figure 6:
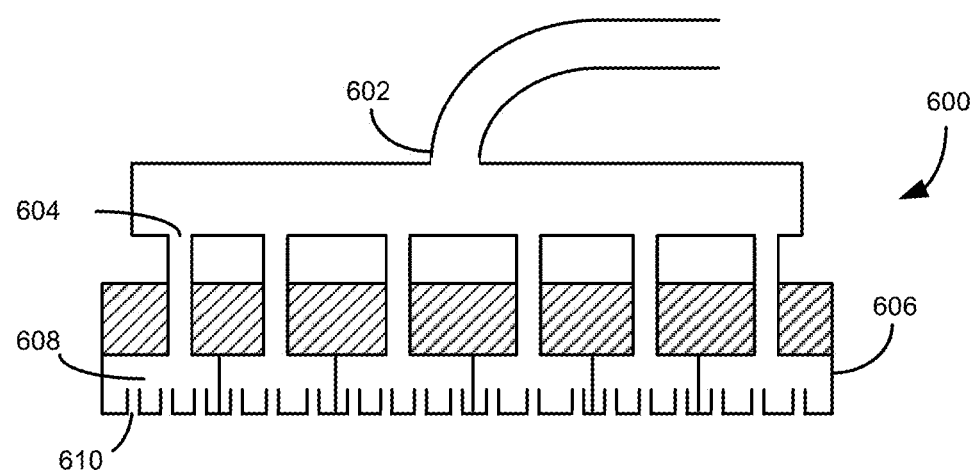
FIG. 6 presents a diagram illustrating a cross-sectional view of a gas-delivery system in accordance with an embodiment of the present invention.

To address the non-uniformity problem, embodiments of the present invention implements a multi-channel gas-delivery plate. FIG. 6 presents a diagram illustrating a cross-sectional view of a gas-delivery system in accordance with an embodiment of the present invention. Gas-delivery system 600 includes a main gas-inlet port 602, a plurality of sub-gas lines, such as sub-gas line 604, and a multi-channel gas-delivery plate 606.

During deposition, precursor gas first enters gas-delivery system 600 through main gas-inlet port 602. Main gas-outlet port 602 can have various dimensions and can be made of different materials. In one embodiment, main gas-inlet port 602 includes a stainless steel tube with an outer diameter (OD) of 0.5 inch. Subsequently, the precursor gas enters multi-channel gas-delivery plate 606 through the sub-gas lines, such as sub-gas line 604. Each sub-gas line is coupled to a flow control valve (not shown), which can individually control the flow rate of the coupling sub-gas line. The sub-gas line can have various dimensions and can be made of different materials. In one embodiment, the sub-gas lines are stainless steel tubes with an OD of 0.25 inch. In addition, various types of flow control valves can be used to control the flow rate in the sub-gas lines. In one embodiment, each sub-gas line is coupled to a bellow metering valve (BMV), which can be individually adjusted.

Multi-channel gas-delivery plate 606 includes a plurality of channels, such as channel 608, each coupled to an individual sub-gas line. For example, channel 608 is coupled to sub-gas line 604. In addition, each channel couples to the reactor chamber though a plurality of gas holes, such as gas hole 610. The number of gas holes per channel and the dimensions of the gas holes can vary. In one embodiment, the gas holes are uniformly sized with an OD of 1 mm. During deposition, precursor gas fills each channel through the coupling sub-gas line before entering the reactor chamber via the gas holes. The relative locations of the sub-gas lines and the channels can be arbitrary. In one embodiment, the sub-gas lines are equally spaced, and each sub-gas line is approximately coupled to the center of each gas channel. To match the gas pressure within the sub-gas lines and the channels, in one embodiment, a gas diffuser (not shown) is inserted between each sub-gas line and each channel.

Because the flow rate within each gas-sub-line can be individually adjusted, the amount of gas flow into the reactor chamber via each channel can also be individually adjusted. Consequently, a uniform gas flow across the horizontal intersection of the narrow channel formed by the two interlocking susceptors can be achieved. For example, by slightly increasing the flow rate in the edge sub-gas lines, the system can match the flow rate between the gas channels located at the edge and the gas channels located in the center. Such adjustment can result in the same amount of precursor gas flow over the surface of wafers at different locations during the deposition process.

FIG. 7A presents a diagram illustrating a 3-dimensional (3-D) view of a multi-channel gas-delivery system in accordance with an embodiment of the present invention. A multi-channel gas-delivery system 700 includes a main gas line 702, a main gas-diffusion space 703, a number of sub-gas lines (such as sub-gas line 704), and a multi-channel gas-delivery plate 708. FIG. 7A illustrates that each sub-gas line is coupled to a flow control valve, such as flow control valve 706, which individually controls the gas flow rate in the sub-gas line.

FIG. 7B presents a 3-D diagram illustrating the amplified view of a region close to sub-gas line 704, in accordance with an embodiment of the present invention. From FIG. 7B, one can see that a gas diffuser 710 is inserted between a gas channel 712 and sub-gas line 704. FIG. 7B also shows that gas channel 712 is coupled to a plurality of gas holes, such as gas hole 714.

Figure 8:
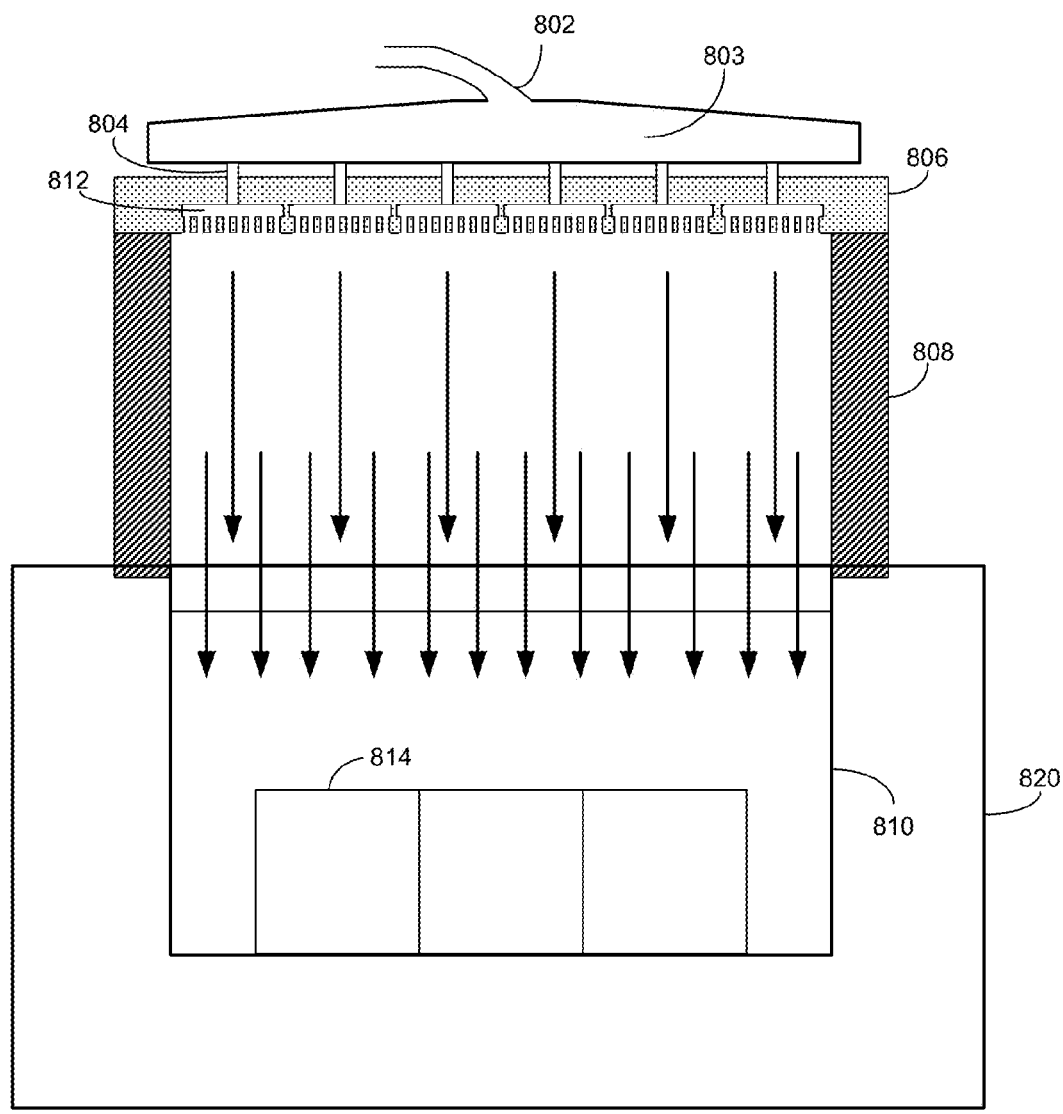
FIG. 8 presents a diagram illustrating a cross-sectional view of a part of a deposition reactor implementing a multi-channel gas-delivery system, in accordance with an embodiment of the present invention.

FIG. 8 presents a diagram illustrating a cross-sectional view of a part of a deposition reactor implementing the multi-channel gas-delivery system, in accordance with an embodiment of the present invention. Deposition reactor 800 includes a main gas line 802, a main gas-diffusion space 803, a number of sub-gas lines (such as sub-gas line 804), a gas-delivery plate 806, a gas nozzle 808, a susceptor 810, and a chamber 820.

During deposition, precursor gas enters the deposition reactor via main gas line 802, which couples to gas-delivery plate 806 though the sub-gas lines. Gas-delivery plate 806 includes a number of gas channels, such as channel 812. Once the precursor gas fills the gas channel, it enters gas nozzle 808, which then leads the gas to the narrow channel formed by two interlocking suceptors, such as susceptor 810, located within chamber 820. A number of wafers, such as wafer 814, are attached to the surface of susceptor 810. Note that deposition reactor 800 may also include other gas nozzles for exhaust or for injecting purging gas into chamber 820. In addition, it is optional to implement the multi-channel gas-delivery system for those nozzles since they don't require uniform gas input.

By individually controlling the flow rate of each sub-gas line, a uniform gas flow (indicated by the arrows in FIG. 8) over the wafers can be created during the deposition process. Note that a uniform flow of precursor gas over the surfaces of the wafers is critical for ensuring uniform film quality and thickness.

Note that, although this disclosure gives an example of a gas-delivery system incorporating 1 main gas line, 6 sub-gas lines, and 6 gas channels, other configurations with fewer or more main gas lines, sub-gas lines, or channels are also possible. In addition, the numbers of gas holes per channel can be different. Also note that, although in the example shown in FIGS. 6 and 7 the main gas line and the sub-gas lines are situated at the center of the delivery plate and the channels, respectively, the relative locations of the gas lines can vary. For example, the main gas line can be placed off center relative to the delivery plate.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A reactor, comprising:
a chamber;
  a gas nozzle positioned on a first side of the chamber; and
a gas-delivery system configured to deliver reaction gases to the chamber via the gas nozzle, and wherein the gas-delivery system comprises:
  a main gas-inlet port for receiving the reaction gases;
    an elongated gas-delivery plate comprising a plurality of gas channels aligned along a length of the elongated gas-delivery plate, wherein the plurality of gas channels comprise two separate edge gas channels positioned near opposite ends of the elongated gas-delivery plate; and
    a plurality of sub-gas lines respectively coupled to the plurality of gas channels, wherein the two edge gas channels are coupled to two separate sub-gas lines from the plurality of sub-gas lines, wherein each sub-gas line is configured to deliver a portion of the received reaction gases to the chamber through a plurality of gas holes belonging to a coupled gas channel, and wherein each sub-gas line is coupled to a flow control valve configured to individually control a gas flow rate within the sub-gas line, thereby facilitating the reaction gases to flow into the chamber uniformly across a horizontal plane.

2. The reactor of claim 1, wherein the main gas-inlet port includes a main gas line, which includes a stainless steel tube with an outer diameter substantially around 0.5 inch.

3. The reactor of claim 1, wherein the flow control valve is a bellow metering valve (BMV).

4. The reactor of claim 1, wherein a respective sub-gas line from the plurality of sub-gas lines includes a stainless steel tube with an outer diameter substantially around 0.25 inch.

5. The reactor of claim 1, wherein the gas holes have a diameter substantially around 1 mm.

6. The reactor of claim 1, further comprising a pair of susceptors situated inside the chamber, wherein each susceptor has a front side and a back side, wherein the front side mounts a number of substrates, wherein the susceptors are positioned vertically in such a way that the front sides of the susceptors face each other, wherein the vertical edges of the susceptors are in contact with each other, thereby forming a substantially enclosed narrow channel between the substrates mounted on different susceptors, and wherein the susceptors are formed using at least one of: SiC-coated graphite and monolithic SiC.

7. The reactor of claim 1, wherein the chamber is made of a material that comprises quartz.

8. The reactor of claim 1, further comprising a gas diffuser situated between the sub-gas line and the coupled gas channel.

9. A material-deposition system, comprising:
a chamber; and
an elongated gas-delivery plate positioned near a first side of the chamber, wherein the elongated gas-delivery plate comprises a plurality of gas channels aligned along a length of the elongated gas-delivery plate, wherein the plurality of gas channels comprise two separate edge gas channels positioned near opposite ends of the elongated gas-delivery plate;
a gas-inlet port positioned near the first side of the elongated gas- delivery plate and configured to receive reaction gases;
a plurality of sub-gas lines coupled between the plurality of gas channels and the gas-inlet port, wherein the two edge gas channels are coupled to two separate sub-gas lines from the plurality of sub-gas lines, wherein each sub-gas line is configured to deliver a portion of the received reaction gases to the chamber through a plurality of gas holes belonging to a coupled gas channel, and wherein each sub-gas line is coupled to a flow control valve configured to individually control a gas flow rate within the sub-gas line, thereby facilitating the reaction gases to flow into the chamber uniformly across a horizontal plane.

10. The material-deposition system of claim 9, further comprising a gas nozzle positioned between the chamber and the elongated gas-delivery plate, wherein the gas nozzle is configured to inject the reaction gases into the chamber.

11. The material-deposition system of claim 9, wherein the gas-inlet port includes a main gas line, which includes a stainless steel tube with an outer diameter substantially around 0.5 inch.

12. The material-deposition system of claim 9, wherein the flow control valve is a bellow metering valve.

13. The material-deposition system of claim 9, wherein a respective sub-gas line from the plurality of sub-gas lines includes a stainless steel tube with an outer diameter substantially around 0.25 inch.

14. The material-deposition system of claim 9, wherein a respective gas hole from the plurality of gas holes has a diameter substantially around 1 mm.

15. The material-deposition system of claim 9, further comprising a pair of susceptors positioned inside the chamber, wherein each susceptor has a front side and a back side, wherein the front side mounts a number of substrates, wherein the susceptors are positioned vertically in such a way that the front sides of the susceptors face each other, wherein the vertical edges of the susceptors are in contact with each other, thereby forming a substantially enclosed narrow channel between the substrates mounted on different susceptors, and wherein the susceptors are formed using at least one of: SiC-coated graphite and monolithic SiC.

16. The material-deposition system of claim 9, wherein the chamber is made of a material that comprises quartz.

17. The material-deposition system of claim 9, further comprising a gas diffuser positioned between a sub-gas line and a corresponding gas channel.

* * * * *